(12) United States Patent
Frech et al.

(10) Patent No.: US 6,967,398 B2
(45) Date of Patent: Nov. 22, 2005

(54) MODULE POWER DISTRIBUTION NETWORK

(75) Inventors: Roland Frech, Ostfildern (DE); Bernd Garben, Schoenaich (DE); Erich Klink, Schoenaich (DE); Stefano Oggioni, Milan (IT)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 10/906,152

(22) Filed: Feb. 4, 2005

(65) Prior Publication Data

US 2005/0167811 A1   Aug. 4, 2005

(30) Foreign Application Priority Data

Feb. 4, 2004   (EP)   ................................. 04100406

(51) Int. Cl.⁷ ............................................ H01L 23/52
(52) U.S. Cl. ................. 257/691; 257/700; 257/750; 257/758; 257/723; 257/724; 257/778; 257/774; 257/775
(58) Field of Search ................ 257/691, 700, 257/778, 723, 724, 774, 775, 750, 758

(56) References Cited

U.S. PATENT DOCUMENTS

| 5,847,936 | A  | * | 12/1998 | Forehand et al. ............ 361/794 |
| 5,886,406 | A  | * | 3/1999  | Bhansali ..................... 257/698 |
| 6,137,168 | A  | * | 10/2000 | Kirkman ...................... 257/691 |
| 6,246,252 | B1 | * | 6/2001  | Malladi et al. ............. 324/765 |
| 6,307,259 | B1 | * | 10/2001 | Asada et al. ................ 257/691 |
| 6,535,398 | B1 | * | 3/2003  | Moresco ..................... 361/792 |
| 6,803,659 | B2 | * | 10/2004 | Suwa et al. ................. 257/738 |
| 2004/0238942 | A1 | * | 12/2004 | Chakravorty et al. ....... 257/700 |
| 2005/0017345 | A1 | * | 1/2005  | Sathe ......................... 257/700 |

* cited by examiner

Primary Examiner—Jasmine Clark
(74) Attorney, Agent, or Firm—Jay H. Anderson

(57) ABSTRACT

A multi-layer module for packaging an electronic component comprises an uppermost electrically conductive layer for mounting the component, a plurality of electrically insulative layers, and a plurality of electrically conductive layers disposed between the insulative layers. The electrically conductive layers form staggered placements of at least three voltage and/or ground distribution layers close to the module surface without signal wiring layers in between, and signal distribution layers comprising signal conductors. Vias form conductive paths through the insulative layers and conductive layers; the corresponding signal, voltage and ground distribution layers are electrically connected with each other and with the uppermost layer.

17 Claims, 3 Drawing Sheets

MODULE POWER DISTRIBUTION NETWORK

FIELD OF THE INVENTION

The present invention relates to a novel power distribution network for a multi-layer module for packaging at least one electronic component. More specifically, the invention relates to the power distribution network design of an inductance reduced module.

BACKGROUND OF THE INVENTION

Multi layer modules are used for the packaging of electronic components, especially integrated circuit chips. Both single chip modules (SCM) and multi chip modules (MCM) are widely used. The most common type of such modules is the multi-layer ceramic packaging module. In this type of module the layers typically are of a ceramic or glass ceramic material. However, other types of thick film technologies are known, such as glass, epoxy or Teflon.

Present day modules made of ceramic, typically multi-layered ceramic modules, are normally mounted onto cards or boards to form the central processing unit (CPU) of a computer. The multi-layer ceramic (MLC) modules typically have chips mounted on the top surface.

As integrated circuit speeds and packaging densities increase, the importance of the packaging technology becomes increasingly significant. For example, as devices approach gigahertz speed, inductance effects may arise from switching, and are particularly problematic in voltage and ground leads.

A standard technology in the above-mentioned state of the art will be explained below. In order to resolve the above-mentioned problems of the conventional multi-layer modules, for example, European Unexamined Patent Publication EP 1 298 972 A2 discloses a multi-layer wiring circuit board capable of conducting high frequency switching operation on the circuit while suppressing the generation of high frequency noise by reducing the inductance of the circuit. The multi-layer wiring circuit board comprises: an uppermost layer designated as a first layer on which parts are mounted; a second layer on which one of a ground layer and an electric power source layer is arranged; a third layer on which the other is arranged; and an insulating layer arranged between the ground layer and the electric power source layer. A resin layer having a thermoplastic adhesion property on both faces is used as material of the insulating layer arranged between the electric power source layer and the ground layer.

On the uppermost surface of the multi-layer wiring circuit board, it is possible to mount any of the chips with the technology of a ball grid array having solder bumps. The electrode pads of the semiconductor chips are connected with the conductor pads on the multi-layer wiring circuit board through the solder bumps.

Another multi-layer circuit substrate having orthogonal grid ground and voltage plane is disclosed in U.S. Pat. No. 6,184,477. The multi-layer circuit substrate is designed to ensure uniform impedance characteristics for signal conductors even when such conductors are installed at a high density. The device consists of a plurality of planar insulating layers laminated together. The patent discloses a first insulating layer bears a first ground plane formed as an orthogonal grid. A second insulating layer, laminated to the first layer, bears a first set of signal wiring, the traces of which are disposed parallel to one of the orthogonal axes of the ground plane. A third insulating layer, laminated to the second layer, bears either a second ground plane formed as an orthogonal grid or a voltage plane formed as an orthogonal grid. A fourth insulating layer, laminated to the third layer, bears a second set of signal wiring, the traces of which are disposed parallel to the other orthogonal axis of the first ground plane. The first and second sets of signal wiring are in electrical communication by means of conductors normal to the surface of the device. A fifth insulating layer, laminated to the fourth layer, bears either a second or third ground plane formed as an orthogonal grid.

The reduction of mid-frequency power noise is of increasing importance for future microprocessors and computer systems.

Accordingly, there is a need for a semiconductor device structure with improved power noise characteristics.

SUMMARY OF THE INVENTION

The present invention addresses the above-mentioned need by providing a multi-layer module having superior electrical properties with reduced inductance combined with lower manufacturing costs and an increase of wireability. In accordance with the present invention, this is done by providing a multi-layer module for packaging at least one electronic component that includes a placement of several voltage and ground layers close to the module surface without signal wiring layers in between.

According to a first aspect of the invention, a multi-layered ceramic (MLC) module is provided with a minimum of 3 mesh planes of voltage/ground layers and a maximum number of connecting vias in between with a minimum via distance.

According to a second aspect of the invention, the voltage/ground pairs at the module surface have a minimum dielectric thickness by minimum spacing with small holes for the through vias in the planes to achieve the electrical effect of a solid plane instead of a mesh plane. This can be realized by organic module technology.

According to another aspect of the invention, the voltage/ground layers are placed under the high switching activity areas (hot spots) of the chip and extend to the nearest module decaps.

BRIEF DESCRIPTION OF THE DRAWINGS

The subject matter which is regarded as the invention is particularly pointed out and distinctly claimed in the concluding portion of the specification. The invention together with further objects and advantages thereof may be best understood by reference to the following description taken in connection with the accompanying drawings, in which:

DETAILED DESCRIPTION OF PREFERRED EMBODIMENTS OF THE INVENTION

Figure 1:
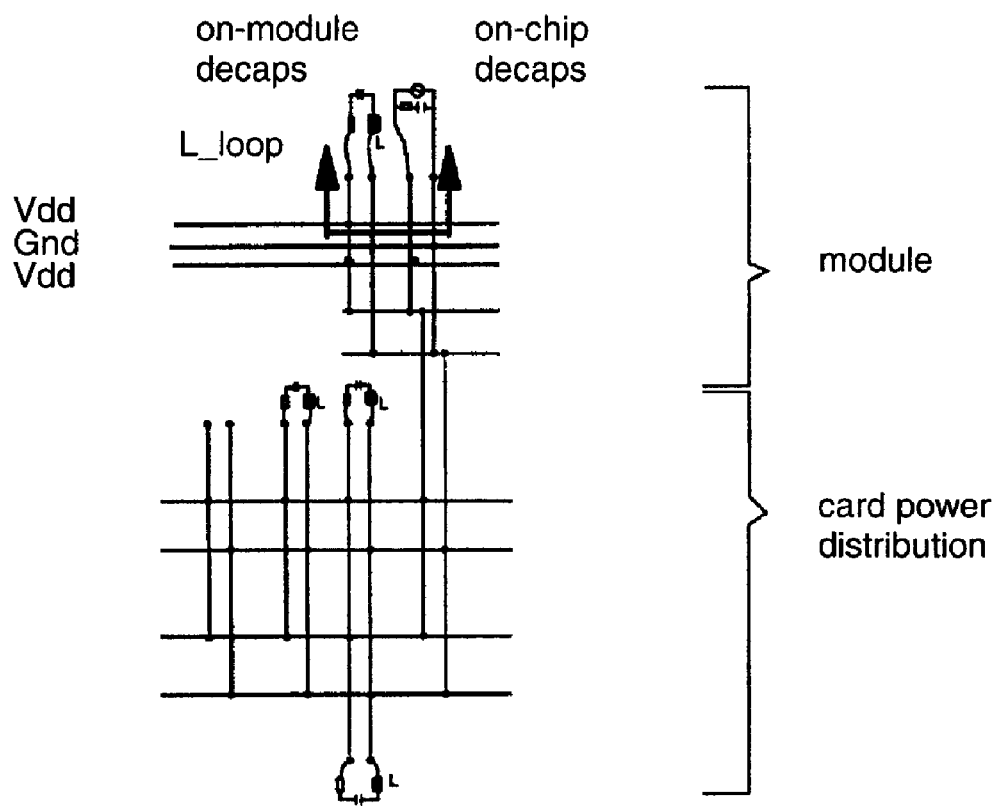
FIG. 1 depicts a package of a module and card with a power distribution scheme.

FIG. 1 depicts a package of a module and card with a power distribution scheme. The reduction of mid-frequency power noise is of increasing importance for future microprocessors and computer systems. The first voltage droop V1, which occurs after a change of the on-chip power consumption, is the major power noise event for many packages. This first voltage droop is caused by a resonant oscillation of the package power distribution formed by the total on-chip decoupling capacitance C1, the capacitance C2 of the nearest module decoupling capacitors ("decaps") and the loop inductance L_loop between both sets of capacitors.

Normally C2 is much larger than C1. Therefore V1 must be reduced by (1) increasing the on-chip decoupling capacitance C1 which is limited by the chip size and the increasing leakage current; and/or (2) reducing L_loop. The loop inductance L_loop is determined by:

a. The inductance of the voltage (Vdd)/ground (Gnd) connections from the chip to the module Vdd/Gnd planes;
b. The path inductance L_path of the effective module Vdd/Gnd planes;
c. The inductance of the Vdd/Gnd connections from the module Vdd/Gnd planes to the module decaps;
d. The module decap connection (mounting) inductance L_pad; and
e. The intrinsic inductance (ESL) of the module decaps.

Figure 2:
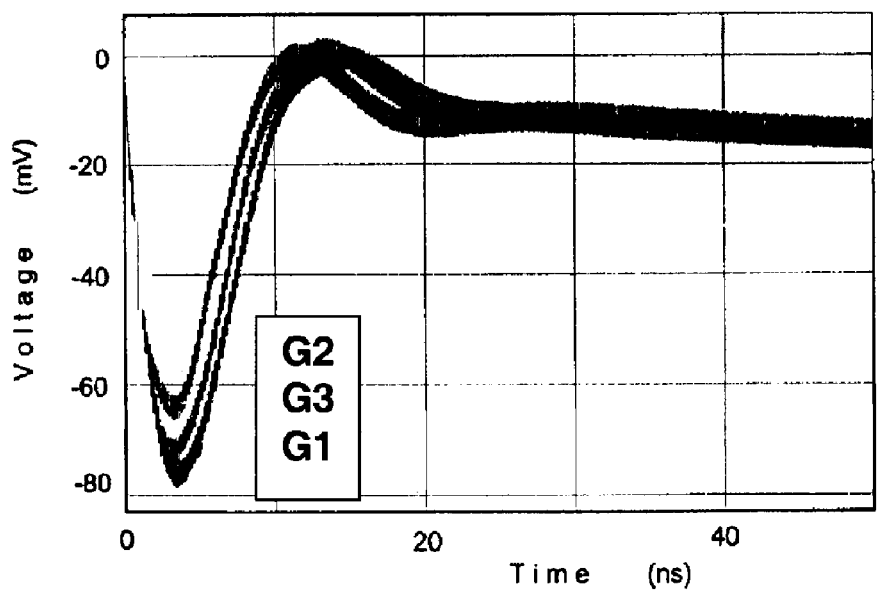
FIG. 2 shows the results of a power noise simulation.

Presently there are several solutions to reduce L_loop; some of these are explained in FIG. 2.

FIG. 2 shows the results of power noise simulations:
(1) for the conventional module design (reference) with one Gnd/Vdd mesh plane pair with 84 μm dielectric thickness (line G1); and
(2) for a module design with two solid planes with 34 μm spacing using organic technology, which reduces V1 in this example by 16% compared with the reference design (line G2).

The plane path inductance L_path is reduced by utilizing thin film module technology, which is primarily employed to increase the wireabilty. However, this thin film technology is not widely used today because it is very expensive. In addition, the module decaps are placed as close as possible adjacent to the chip and at all four chip edges.

Figure 3:
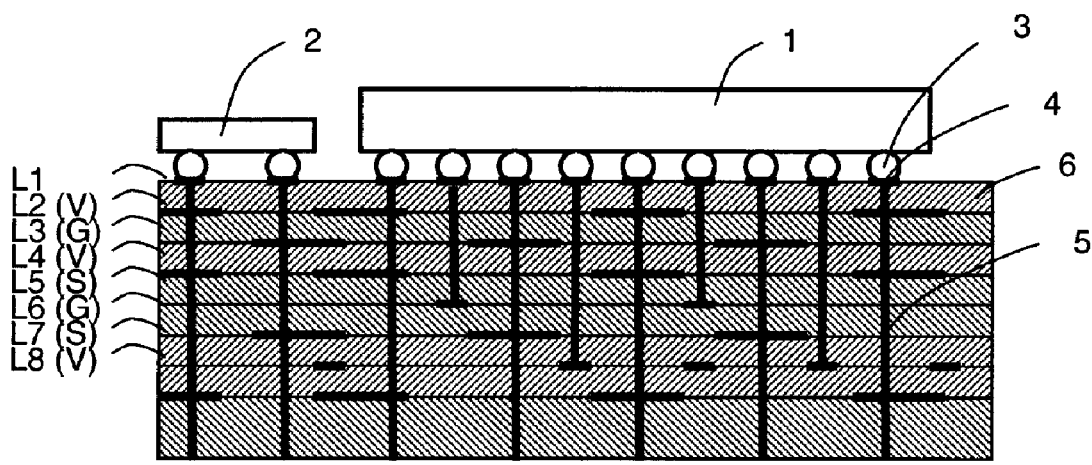
FIG. 3 shows in side view the wiring scheme of an embodiment of the invention.

An embodiment of the invention is shown in FIG. 3. The plane path inductance L_path is reduced in a cost-effective manner by staggered placement of several Vdd/Gnd layers close to the module surface without signal wiring layers in between, but with a maximum number of connecting Vdd/Gnd vias with minimum via distance. The embodiment in FIG. 3 shows as example three voltage/ground distribution layers (Vdd/Gnd/Vdd) at the module surface. For a module design with three mesh planes with 84 μm dielectric thickness, V1 is reduced in this example by 5% (shown in FIG. 2; line G3).

More specifically, FIG. 3 is a sectional view of a multi-layer module, in which the uppermost conductive surface layer L1 has provided thereon conductive pads 4 which are used for mounting electronic parts such as semiconductor chip 1 or decaps 2. The semiconductor chip 1 of the ball grid array (BGA) type is mounted by solder bumps 3 on the conductive pads 4 of the module. In order to reduce noise, which is generated by inductances when switching activity of the circuits is changed, decaps 2 mounted on the module surface are arranged between the electric power source and ground.

Between the uppermost surface conductive pads 4 and the first voltage layer L2, there is provided an insulating film 6 as a surface layer; for example, a resin film on which laser beam patterning is conducted.

The third layer L3 is formed as a first ground layer. The fourth layer L4 is formed as a second voltage distribution layer. Alternatively, the second layer L2 may be formed as a ground layer, the third layer L3 may be formed as a first voltage layer, and the fourth layer L4 may be formed as a second ground layer.

The insulating films 6 provided between the different voltage and ground layers are preferably organic films with a thermoplastic adhesive property on both faces, or ceramic layers. An example of the insulating film is a polyimide film, on which laser beam patterning can be conducted.

Furthermore, the first voltage distribution layer L2 installed nearest to the module surface and the second voltage distribution layer L4 below are electrically connected to each other and with the uppermost conductive surface layer L1 by vias 5 forming conductive paths through the insulative layers lying between.

In the same manner as that described above, the first ground layer L3 and the surface conductive pads 4 are electrically connected to each other by vias through the insulative layers and the first voltage layer L2.

The first signal layer L5 is arranged below the second voltage layer L4. The insulating film, which is arranged between the second voltage plane L4 of the fourth layer and the fifth layer L5 and also between the following layers, may be made in ceramic technology with a thickness of approximately 80 μm.

A second ground layer L6 is disposed in a sixth layer below the first signal layer L5. The second ground layer L6 and the first ground layer L3 are electrically connected to each other by vias 5 which pass through the insulating layers lying between, in a direction normal to the layers.

In the same manner, additional signal layers L7 and voltage layers L8 are arranged below the second ground layer L6; these are connected to respective signal and voltage layers above by vias 5 which pass through the insulating layers lying between, in a direction normal to the layers.

Figure 4:
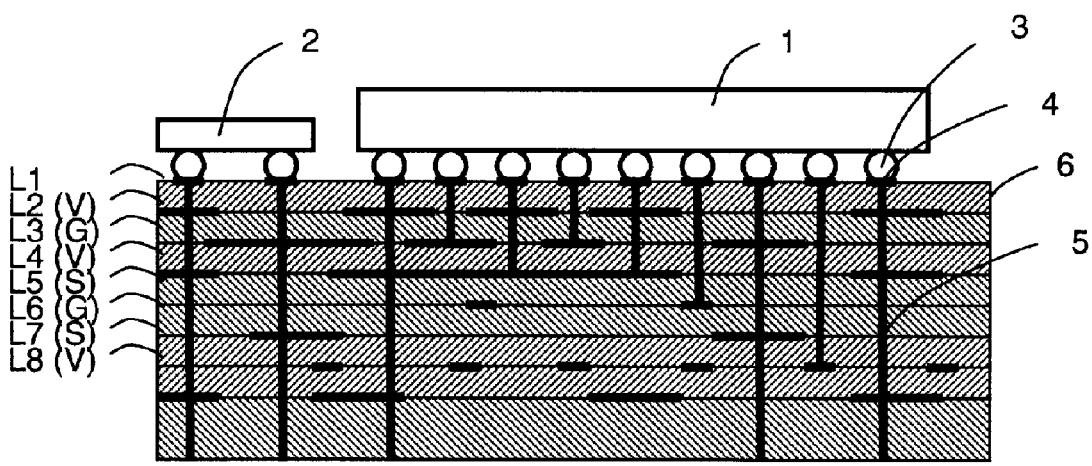
FIG. 4 shows in side view the wiring scheme of another embodiment of the invention.

FIG. 4 shows in side view the wiring scheme of a second embodiment of the invention. A staggered placement of three layers Vdd/Gnd/Vdd near the module surface with minimum spacing (dielectric thickness) is shown, without a signal wiring layer in between, and with small holes for the through vias in the planes to achieve the electrical effect of a solid plane instead of a mesh plane. The signal connections of the chip and the module signal vias are not arranged in local areas. The Vdd/Gnd/Vdd planes are not placed over the entire module area; they are placed preferably under the high switching activity areas ("hot spots") of the chip and extend to the nearest module decaps. This can be realized using organic module technology.

Figure 5:
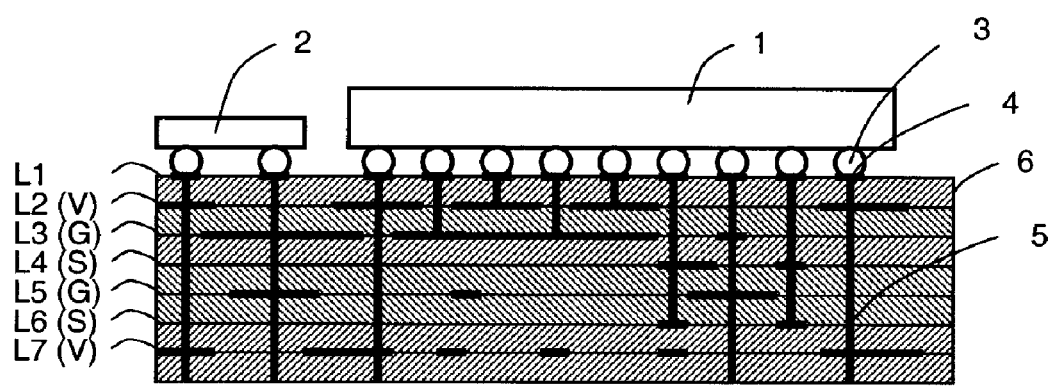
FIG. 5 shows in side view the wiring scheme of another aspect of the invention.

FIG. 5 is a sectional view showing a multi-layer module according to another aspect of the invention. The staggered placement of two layers Vdd/Gnd near the module surface is shown, without signal wiring layers in between. In the same manner as shown in FIG. 4 the signal connections of the chip and the module signal vias are not arranged in local areas. The voltage and/or ground distribution layers are not placed over the entire module area; they are placed preferably under the high switching activity areas of the chip and extend to the nearest module decaps. This can be realized using organic module technology.

On the uppermost conductive surface layer L1 of the multi-layer module, there are provided conductive pads 4 for mounting electronic parts such as semiconductor chips 1 or decaps 2. The semiconductor chip 1 of the ball grid array (BGA) type is mounted by solder bumps 3 on the conductive pads 4 of the module. The electrode pads 3 of the semiconductor chip 1 are connected with the conductive pads 4 on the module through an array of solder bumps 3. In order to reduce noise, which is generated by the inductances when switching activity of circuits is changed, decaps 2 are arranged between the electric power source and ground.

Between the uppermost surface conductive pads 4 and the first voltage layer L2, there is provided an insulating film 6 as a surface layer.

The third layer L3 is formed as a first ground layer. Alternatively, the second layer L2 may be formed as a ground layer, the third layer L3 may be formed as a first voltage layer. It is preferable that the thickness of these layers be kept small.

The insulating films 6 provided between the different voltage and ground layers may be organic films or ceramic layers. An example of the insulating film is a polyimide film, on which laser beam patterning can be conducted.

Furthermore, the first voltage distribution layer L2 installed nearest to the module surface is electrically connected to the other voltage plane and to the uppermost conductive surface layer L1 by vias 5 forming conductive paths through the insulative layers lying between, in a direction normal to the layers.

In the same manner as that described above, the first ground layer L3 and the surface conductive pads 4 are electrically connected to each other by vias through the insulative layers and the first voltage layer L2.

The first signal layer L4 is arranged below the first ground plane L3. The insulating film, which is arranged between the first ground plane L3 of the second layer and the third layer and also between the following layers, may be made in ceramic technology with a thickness of approximately 80 $\mu$m.

A further second ground layer L5 is disposed in a fifth layer below the first signal layer L4. The second ground layer L5 and the first ground layer L3 are electrically connected to each other by vias which pass through the insulating layers lying between.

In the same manner further signal layers L6 and voltage planes L7 are arranged below the second ground layer L5; these layers are connected to respective signal and voltage layers above by vias which pass through the insulating layers lying between.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A multi-layer module for packaging at least one electronic component, said module comprising:
   an uppermost electrically conductive layer for mounting the electronic component thereon;
   a plurality of electrically insulative layers;
   a plurality of electrically conductive layers, each of said electrically conductive layers being disposed between said electrically insulative layers, said electrically conductive layers forming staggered placements of at least three voltage and/or ground distribution layers close to the uppermost layer without signal wiring layers between said electrically conductive layers and said uppermost layer;
   signal distribution layers comprising signal conductors; and
   vias forming conductive paths through said insulative layers and said conductive layers, so that corresponding signal, voltage and ground distribution layers are electrically connected with each other and with the uppermost layer.

2. A multi-layer module according to claim 1, wherein said electrically conductive layers are mesh planes.

3. A multi-layer module according to claim 1, wherein said staggered placements of layers are alternating voltage layers and ground layers, and the uppermost of the at least three distribution layers is a voltage layer.

4. A multi-layer module according to claim 1, wherein said staggered placements of layers are alternating voltage layers and ground layers, and the uppermost of the at least three distribution layers is a ground layer.

5. A multi-layer module according to claim 1, wherein said electrically insulative layers are of ceramic material.

6. A multi-layer module according to claim 1, wherein said electrically insulative layers are flexible foils.

7. A multi-layer module according to claim 1, wherein the thickness of said insulative layers between the ground distribution layers is not more than 35 $\mu$m.

8. A multi-layer module according to claim 1, wherein said vias are not arranged in local areas through the voltage and/or ground distribution layers to achieve the electrical effect of solid planes.

9. A multi-layer module according to claim 8, wherein said local areas extend to at least one nearest module decoupling capacitor.

10. A multi-layer module according to claim 8, wherein said local areas are arranged under high switching activity areas of a chip.

11. A multi-layer module for packaging at least one electronic component, said module comprising:
    an uppermost electrically conductive layer for mounting the electronic component thereon;
    a plurality of electrically insulative layers;
    a plurality of electrically conductive layers, each being disposed between said electrically insulative layers, said electrically conductive layers forming staggered placements of a voltage and a ground distribution layer close to the uppermost layer without signal wiring layers between the electrically conductive layers and the uppermost layer;
    signal distribution layers comprising signal conductors; and
    vias forming conductive paths through said insulative layers and said conductive layers, so that the corresponding signal, voltage and ground distribution layers are electrically connected with each other and with the uppermost layer,
    wherein said vias are not arranged in local areas through the voltage and/or ground distribution layers to achieve the electrical effect of solid planes.

12. A multi-layer module according to claim 11, wherein said electrically insulative layers are of ceramic material.

13. A multi-layer module according to claim 11, wherein said electrically insulative layers are flexible foils.

14. A multi-layer module according to claim 11, wherein the thickness of said insulative layers between the ground distribution layers is not more than 35 $\mu$m.

15. A multi-layer module according to claim 11, wherein said vias are formed so as to extend through said insulative layers in a direction normal to the layers.

16. A multi-layer module according to claim 11, wherein said local areas extend to at least one nearest module decoupling capacitor.

17. A multi-layer module according to claim 11, wherein said local areas are arranged under high switching activity areas of a chip.

\* \* \* \* \*